United States Patent
Tanzawa

(10) Patent No.: US 9,721,960 B2
(45) Date of Patent: Aug. 1, 2017

(54) DATA LINE ARRANGEMENT AND PILLAR ARRANGEMENT IN APPARATUSES

(71) Applicant: Micron Technology, Inc., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 67 days.

(21) Appl. No.: 14/656,980

(22) Filed: Mar. 13, 2015

(65) Prior Publication Data

US 2016/0268280 A1  Sep. 15, 2016

(51) Int. Cl.
| | |
|---|---|
| H01L 27/11519 | (2017.01) |
| H01L 27/11565 | (2017.01) |
| H01L 27/11582 | (2017.01) |
| H01L 27/11556 | (2017.01) |

(52) U.S. Cl.
CPC .. *H01L 27/11565* (2013.01); *H01L 27/11519* (2013.01); *H01L 27/11556* (2013.01); *H01L 27/11582* (2013.01)

(58) Field of Classification Search
CPC ......... H01L 27/11519; H01L 27/11524; H01L 27/11565; H01L 27/1157
See application file for complete search history.

(56) References Cited

U.S. PATENT DOCUMENTS

| | | | | |
|---|---|---|---|---|
| 6,590,250 | B2 * | 7/2003 | Juengling | ........... H01L 21/0331 257/303 |
| 7,808,042 | B2 * | 10/2010 | Juengling | ......... H01L 27/10826 257/288 |
| 7,898,850 | B2 | 3/2011 | Min et al. | |

(Continued)

OTHER PUBLICATIONS

Choi et al., "3D Approaches for Non-volatile Memory", VLSI Technology Digest of Technical Papers, 2011 Symposium, pp. 178-179.

(Continued)

*Primary Examiner* — Davienne Monbleau
*Assistant Examiner* — Leslie Pilar Cruz
(74) *Attorney, Agent, or Firm* — Wells St. John P.S.

(57) ABSTRACT

Some embodiments include an apparatus having semiconductor pillars in a modified hexagonal packing arrangement. The modified hexagonal packing arrangement includes a repeating pattern having at least portions of 7 different pillars. Each of the 7 different pillars is immediately adjacent to six neighboring pillars. A distance to two of the six neighboring pillars is a short distance, $d_s$; and a distance to four of the six neighboring pillars is a long distance, $d_l$. Some embodiments include an apparatus having semiconductor pillars in a packing arrangement. The packing arrangement comprises alternating first and second rows, with pillars in the first rows being laterally offset relative to pillars in the second rows. A distance between neighboring pillars in a common row as one another is a short distance, $d_s$, and a distance between neighboring pillars that are not in common rows as one another is a long distance, $d_l$.

21 Claims, 8 Drawing Sheets

(56) References Cited

U.S. PATENT DOCUMENTS

| | | | |
|---|---|---|---|
| 8,633,535 B2* | 1/2014 | Matsuo | H01L 27/11565 257/324 |
| 8,778,762 B2 | 7/2014 | Keshav et al. | |
| 9,159,736 B2* | 10/2015 | Vu | H01L 27/11519 |
| 2009/0238000 A1* | 9/2009 | Juengling | H01L 27/10826 365/185.13 |
| 2013/0334594 A1 | 12/2013 | Imonigie et al. | |
| 2014/0131784 A1 | 5/2014 | Davis et al. | |
| 2014/0191306 A1 | 7/2014 | Hopkins | |

OTHER PUBLICATIONS

Jang et al., "Vertical Cell Array using TCAT (Terabit Cell Array Transistor) Technology for Ultra High Density NAND Flash Memory", VLSI Technology Digest of Technical Papers, 2009 Symposium, pp. 192-193.

Katsumata et al., "Pipe-shaped BiCS Flash Memory with 16 Stacked Layers and Muliti-Level-Cell Operation for Ultra High Density Storage Devices", VLSI Technology Digest of Technical Papers, 2009 Symposium, pp. 136-137.

Kim et al, "Novel Vertical-Stacked-Array-Transistor (VSAT) for ultra-high-density and cost-effective NAND Flash memory devices and SSD (Solid State Drive)", VLSI Technology Digest of Technical Papers, 2009 Symposium, pp. 186-187.

Kim et al., "Multi-Layered Vertical Gate NAND Flash Overcoming Stacking Limit for Terabit Density Storage", VLSI Technology Digest of Technical Papers, 2009 Symposium, pp. 188-189.

Komori et al., "Disturbless Flash Memory due to High Boost Efficiency on BiCS Structure and Optimal Memory Film Stack for Ultra High Density Storage Device", Electron Devices Meeting, Dec. 2008. IEDM 2008. IEEE International, pp. 1-4.

U.S. Appl. No. 14/175,901, filed Feb. 7, 2014 by Vu et al.

* cited by examiner

DATA LINE ARRANGEMENT AND PILLAR ARRANGEMENT IN APPARATUSES

TECHNICAL FIELD

Data lines, select gates and pillar arrangements in apparatuses such as vertical NAND.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells. Example NAND architecture is described in U.S. Pat. Nos. 7,898,850 and 8,778,762, and in U.S. Patent Publication Nos. 2014/0191306 and 2014/0131784.

FIG. 1 shows a block diagram of a prior art device 100 which includes a memory array 102 having a plurality of memory cells 103 arranged in rows and columns along with access lines 104 (e.g., word lines to conduct signals WL0 through WLm) and first data lines 106 (e.g., bitlines to conduct signals BL0 through BLn). Access lines 104 and first data lines 106 may be used to transfer information to and from the memory cells 103. A row decoder 107 and a column decoder 108 decode address signals A0 through AX on address lines 109 to determine which ones of the memory cells 103 are to be accessed. A sense amplifier circuit 115 operates to determine the values of information read from the memory cells 103. An I/O circuit 117 transfers values of information between the memory array 102 and input/output (I/O) lines 105. Signals DQ0 through DQN on the I/O lines 105 can represent values of information read from or to be written into the memory cells 103. Other devices can communicate with the device 100 through the I/O lines 105, the address lines 109, or the control lines 120. A memory control unit 118 controls memory operations to be performed on the memory cells 103 utilizing signals on the control lines 120. The device 100 can receive supply voltage signals Vcc and Vss on a first supply line 130 and a second supply line 132, respectively. The device 100 includes a select circuit 140 and an input/output (I/O) circuit 117. The select circuit 140 can respond, via the I/O circuit 117, to signals CSEL1 through CSELn to select signals on the first data lines 106 and the second data lines 113 that can represent the values of information to be read from or to be programmed into the memory cells 103. The column decoder 108 can selectively activate the CSEL1 through CSELn signals based on the A0 through AX address signals on the address lines 109. The select circuit 140 can select the signals on the first data lines 106 and the second data lines 113 to provide communication between the memory array 102 and the I/O circuit 117 during read and programming operations.

FIG. 2 shows a block diagram of a prior art memory array (e.g., the memory array 102 of FIG. 1) in the form of a 3D NAND memory device 200. The device 200 may comprise a plurality of strings of charge storage devices. In a first (e.g., Z-Z') direction, each string of charge storage devices may comprise, for example, thirty two charge storage devices stacked over one another with each charge storage device corresponding to one of, for example, thirty two tiers (e.g., Tier0-Tier31). The charge storage devices of a respective string may share a common channel region, such as one formed in a respective pillar of semiconductor material (e.g., polysilicon) about which the string of charge storage devices are formed. In a second (e.g., X-X') direction, each first group of, for example, sixteen first groups of the plurality of strings may comprise, for example, eight strings sharing a plurality (e.g., thirty two) of access lines (WLs). Each of the plurality of access lines (hereinafter used interchangeably with "global control gate (CG) lines") may couple (e.g., electrically or otherwise operably connect) the charge storage devices corresponding to a respective tier of the plurality of tiers of each string of a corresponding one of the first groups. The charge storage devices coupled by the same access line (and thus corresponding to the same tier) may be logically grouped into, for example, two pages, such as P0/P32, P1/P33, P2/P34 and so on, when each charge storage device comprises a multi-level cell capable of storing two bits of information. In a third (e.g., Y-Y') direction, each second group of, for example, eight second groups of the plurality of strings may comprise sixteen strings coupled by a corresponding one of eight data lines (BLs). The CGs of the (e.g., sixteen) charge storage devices corresponding to a respective tier of the (e.g., sixteen) strings of each second group of strings may be physically coupled by a respective plate. Similarly, SGSs of the (e.g., sixteen) strings of each second group of strings may be physically coupled by a single plate. The size of a memory block may comprise 1,024 pages and total about 16 MB (e.g., 16 WLs×32 Tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332-336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge storage devices corresponding to the respective partial block and/or tier independently of those of other partial blocks and/or other tiers. The charge storage devices corresponding to the respective subset (e.g., partial block) and the respective tier may comprise a "partial tier" (e.g., a single "tile") of charge storage devices. The strings corresponding to the respective subset (e.g., partial block) may be coupled to a corresponding one of sub-sources 372, 374 and 376 (e.g., "tile source") with each sub-source being coupled to a respective power source.

FIG. 4 shows a prior art apparatus 10 having a plurality of vertically-stacked memory cells 15. Breaks are provided within vertical stacks 12-14 of memory cells 15 to indicate that there may be additional memory cells besides those shown. Any suitable number of memory cells may be present. For instance, the individual stacks 12-14 may comprise 8 memory cells, 16 memory cells, 32 memory cells, 64 memory cells, . . . , 256 memory cells, 512 memory cells, etc. The stacks 12-14 can be provided over an electrically conductive material 16, which in turn can be supported by a semiconductor base 18. A break is provided between the material 16 and the base 18 to indicate that there may be additional materials and/or integrated circuit structures between the base and the material 16. Similarly, a break is provided between the material 16 and each of the stacks 12-14 to indicate that there may be additional materials and/or integrated circuit structures between the stacks and the material 16. The material 16 may comprise a common source and/or source-side select gate (SGS); with the term source-side indicating that material 16 is on the source side of the stacks 12-14. Material 16 may comprise p-type doped silicon and/or other suitable conductively-doped semiconductor material. Bitlines (not shown) may be provided above material 16, with such bitlines being "drain" connections to stacks. Semiconductor base 18 may comprise semiconductor material, and in some embodiments may comprise, consist essentially of, or consist of monocrystalline silicon. SGD devices 20-22 (e.g., transistors having the SGDs as control gates) are provided over stacks 12-14, respectively. The SGDs may comprise one or more of various metals (for instance, tungsten, titanium, etc.), metal-containing compositions (for instance, metal silicide, metal nitride, etc.), and conductively-doped semiconductor materials (for instance, conductively-doped silicon). The SGD devices are drain-side devices in that they are on the drain side of the stacks 12-14.

DETAILED DESCRIPTION OF THE ILLUSTRATED EMBODIMENTS

Some embodiments pertain to vertical stacks of memory cells associated with (e.g., surrounding) substantially vertical semiconductor (e.g., polysilicon) pillars extending upwardly from a semiconductor substrate. The pillars may be in a modified hexagonal packing arrangement, or in any other suitable packing arrangement. The pillars may extend through, and be associated with, vertically-stacked memory cells. The term "substantially vertical" means vertical to within reasonable tolerances of fabrication and measurement.

Data lines (referred to herein by example as bitlines) and drain-side select gates (SGDs) may be provided proximate the pillars. The SGDs may be separated from the pillars by gate dielectric material (such as, for example, silicon dioxide). The bitlines may be provided proximate to (e.g., over) respective ends of a plurality of the pillars, and define columns; and the SGDs may be provided proximate to (e.g., at least partially surround) respective ends of a plurality of pillars and define tiles. In operation, activation of a particular SGD causes one or more respective pillars to be electrically coupled to one or more respective bitlines.

Figure 1:
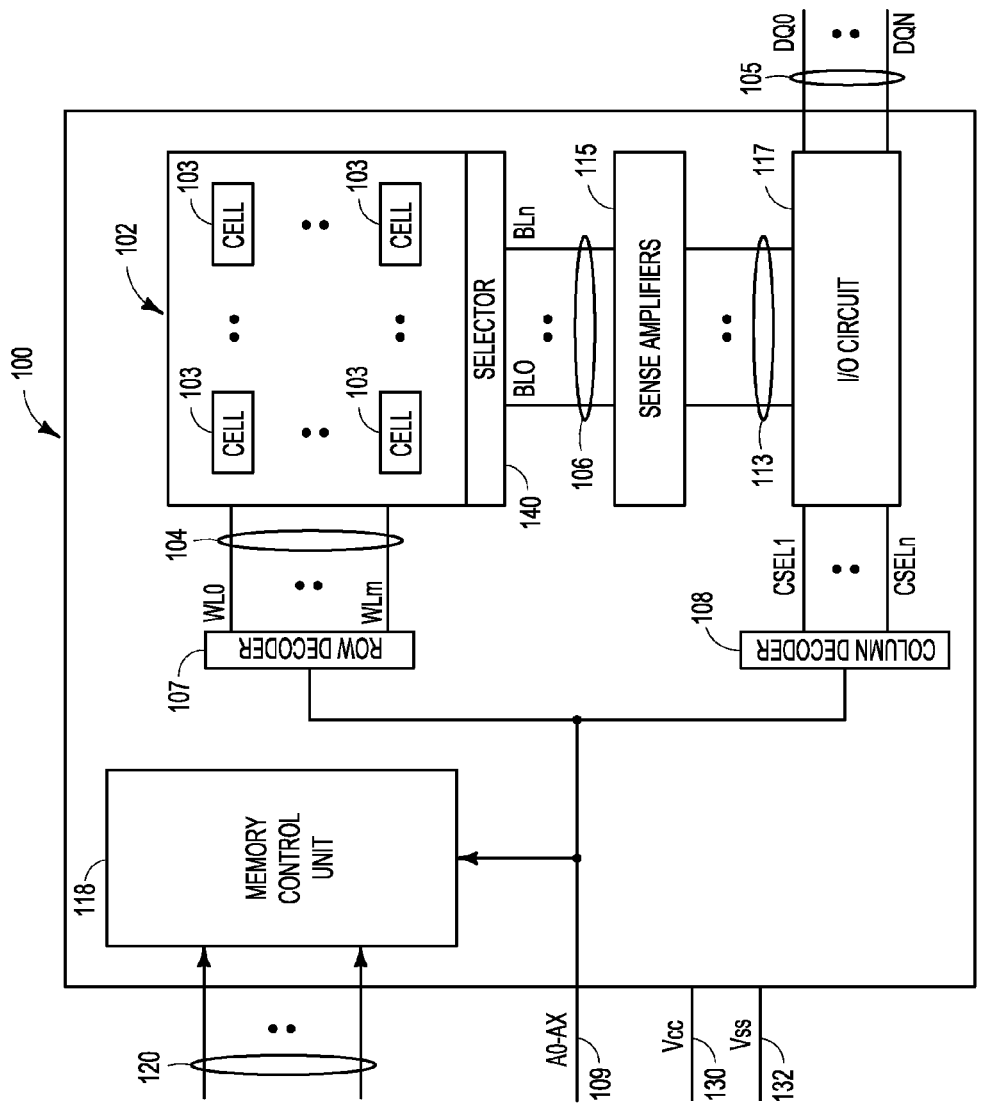
FIG. 1 shows a block diagram of a prior art memory device having a memory array with memory cells.
Figure 2:
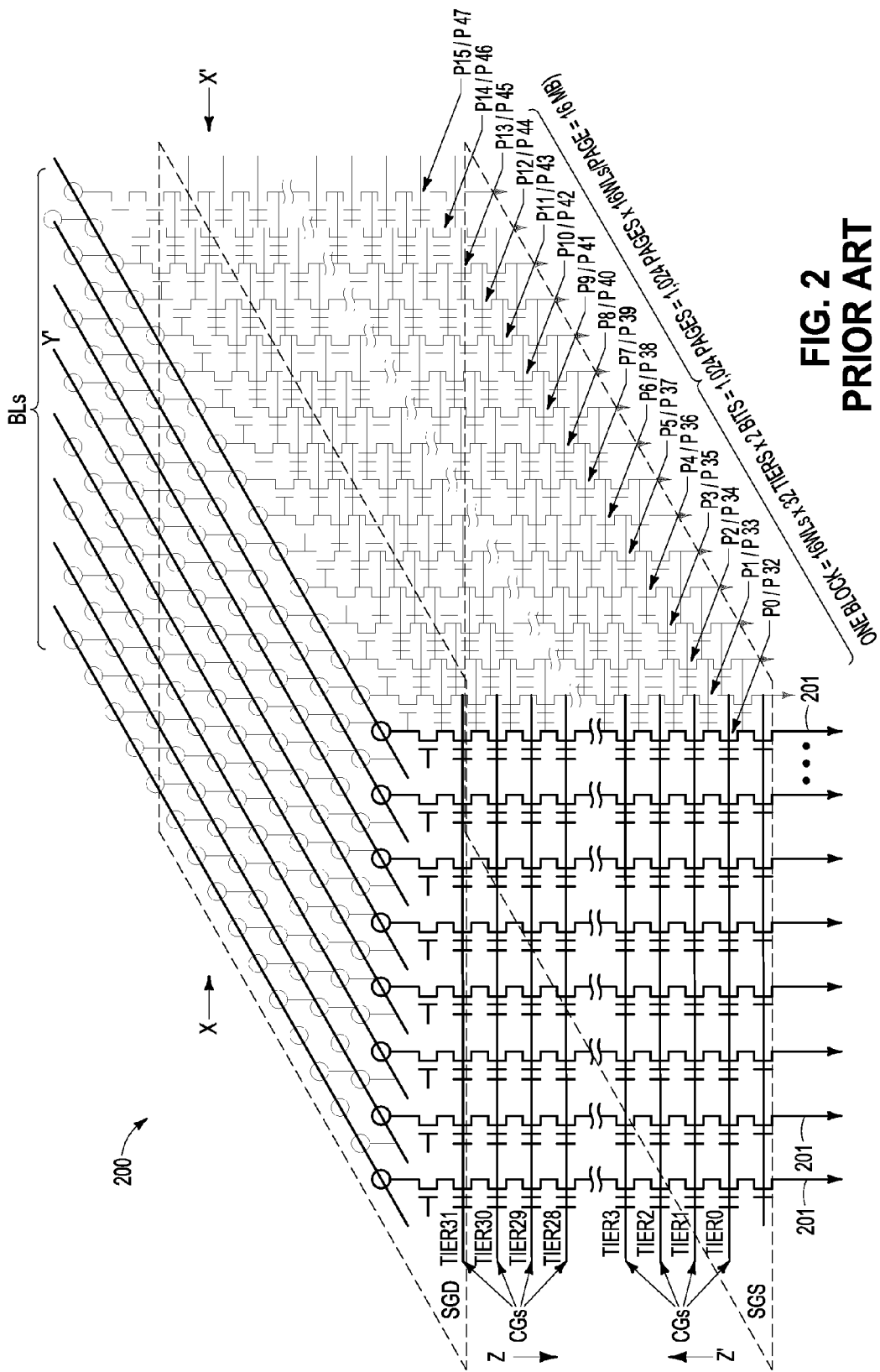
FIG. 2 shows a schematic diagram of the prior art memory array of FIG. 1 in the form of a 3D NAND memory device.
Figure 3:
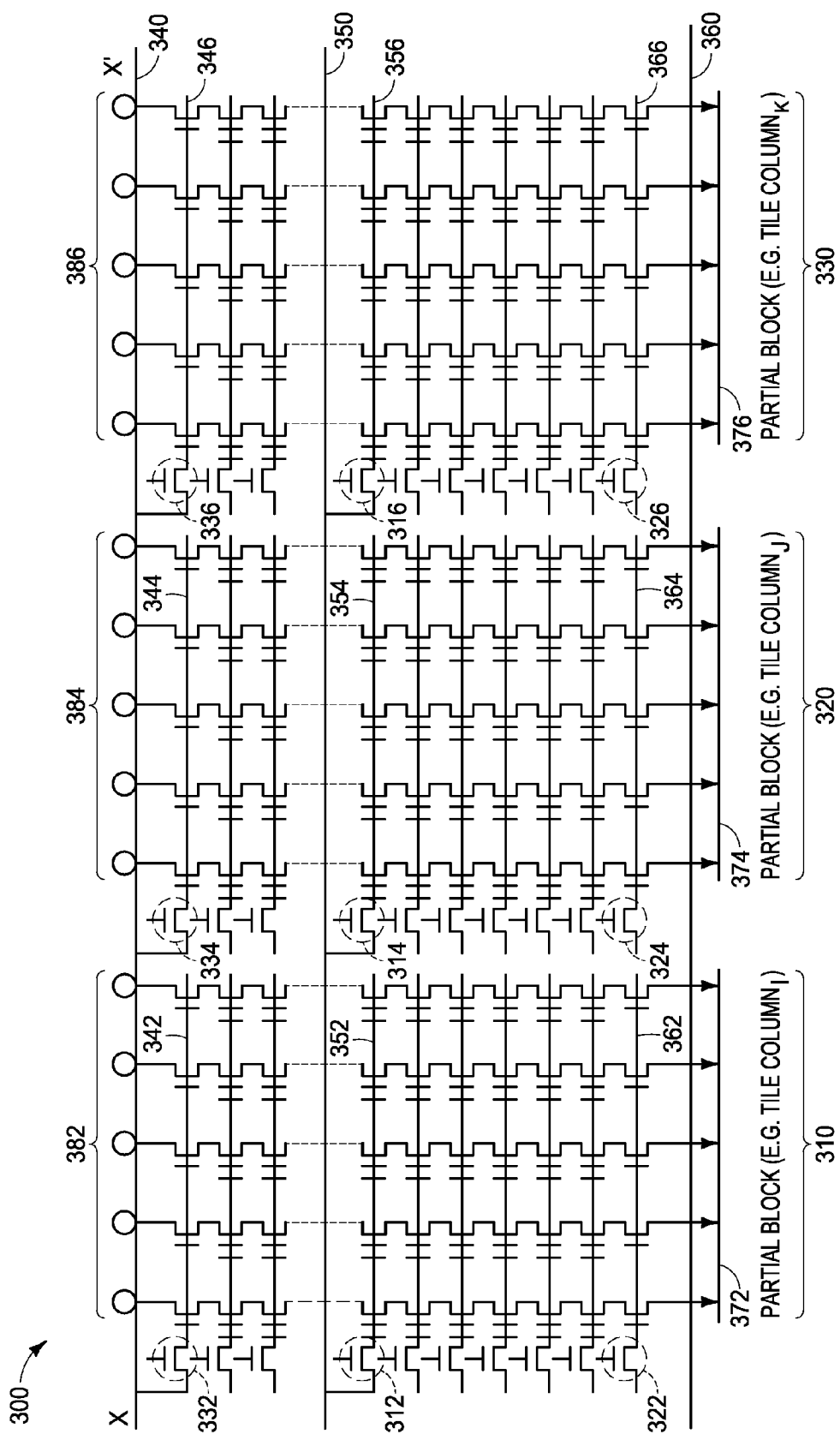
FIG. 3 shows a cross sectional view of the prior art 3D NAND memory device of FIG. 2 in an X-X' direction.
Figure 4:
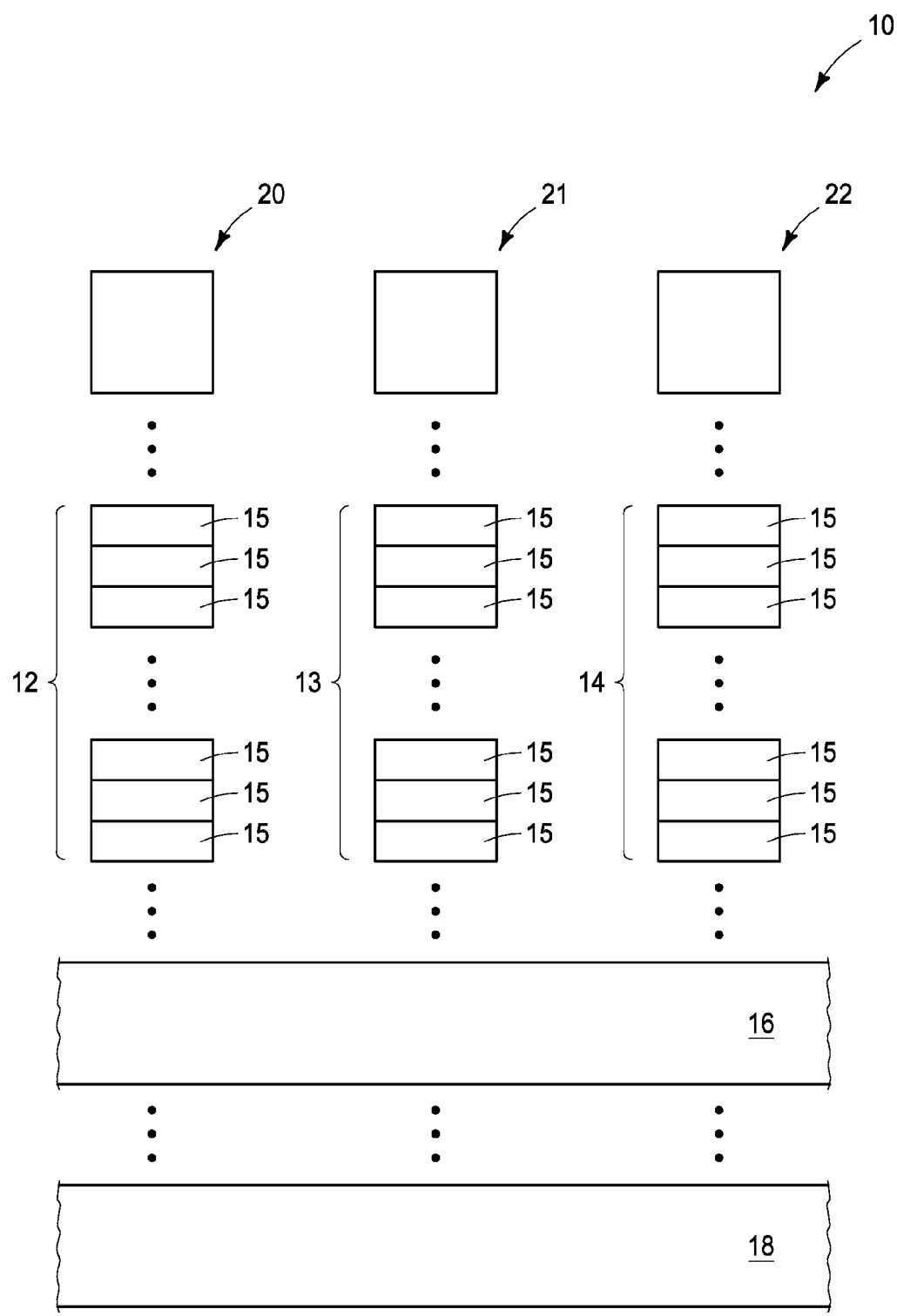
FIG. 4 is a diagrammatic cross-sectional view of a portion of a prior art apparatus including vertical stacks of memory cells.
Figure 5:
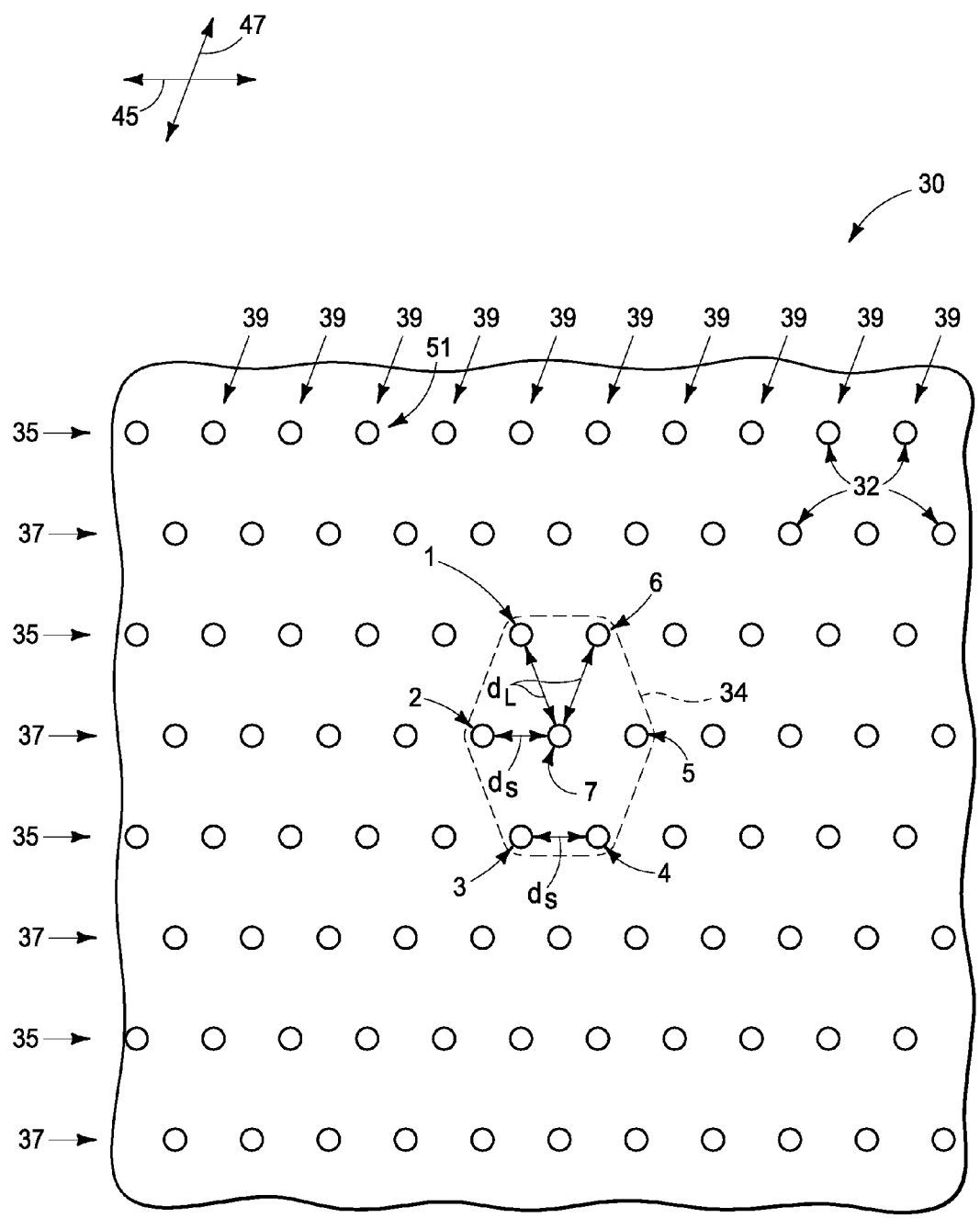
FIG. 5 is a diagrammatic top view of a portion of an apparatus including semiconductor pillars in an example packing arrangement.

Example embodiments are described below with reference to FIGS. 5-9. FIG. 5 shows a top view of an apparatus 30 having a plurality of pillars 32 (only some of which are labeled) in an example packing arrangement. The pillars may extend vertically, or at least substantially vertically. The pillars 32 are associated with vertically stacked memory cells; and may be, for example, associated with stacks 12-14 of the type described with reference to prior art FIG. 4. The pillars may comprise semiconductor material (such as polysilicon). In some embodiments, the pillars may comprise semiconductor material at least partially surrounding dielectric material (for instance, silicon dioxide). Central pillars of vertically-stacked memory cells are illustrated to simplify the drawing, as opposed to showing entire lateral dimensions of the vertically-stacked memory cells.

The packing arrangement of FIG. 5 comprises pillars in alternating rows 35 and 37, with the pillars in rows 35 being laterally offset relative to those in rows 37. In some embodiments, rows 35 and 37 may be referred to as first and second rows, respectively. A distance between neighboring (i.e., immediately adjacent) pillars in a common row as one another is a short distance, $d_s$, and a distance between neighboring pillars that are not in common rows as one another is a long-distance, $d_l$. The distance $d_l$ is greater than the distance $d_s$; and in some instances $d_l$ may be within a range of from about 1.1 times $d_s$ to about 5 times $d_s$. In specific instances, $d_l$ may be at least about 1.1 times $d_s$, at least about 1.3 times $d_s$, at least about 1.5 times $d_s$, etc.

In some embodiments, the packing arrangement of FIG. 5 may be referred to as a modified hexagonal packing arrangement, and comprises a repeating pillar pattern. One of such repeating patterns is specifically labeled as a pattern 34 in FIG. 5. The pattern 34 comprises seven sequentially-numbered pillars (numbered 1-7). The sequentially-numbered pillars are identical to all of the other pillars 32 (only some of which are labeled), but are numbered with sequential integers to assist in illustrating pillar pattern 34. The repeating pillar pattern comprises portions of the pillars 1-6, and comprises an entirety of pillar 7; and accordingly comprises at least portions of seven different pillars.

The pillar pattern 34 is a modified hexagonal-shape. Specifically, each pillar 32 has six neighboring pillars, with a distance to two of the six neighboring pillars being the short distance, $d_s$, and with a distance to four of the six neighboring pillars being the long distance, $d_l$.

The first and second rows 35 and 37 extend along a first direction, with such first direction being along an illustrated axis 45. Accordingly, the short distance, $d_s$, may be considered to be measured between neighboring pillars along the direction of axis 45.

The packing arrangement of pillars 32 comprises columns 39 extending along a second direction of an illustrated axis 47. The second direction of axis 47 intersects the first direction of axis 45. The long-distance, $d_l$, is a distance between neighboring pillars along the columns 39.

Figure 6:
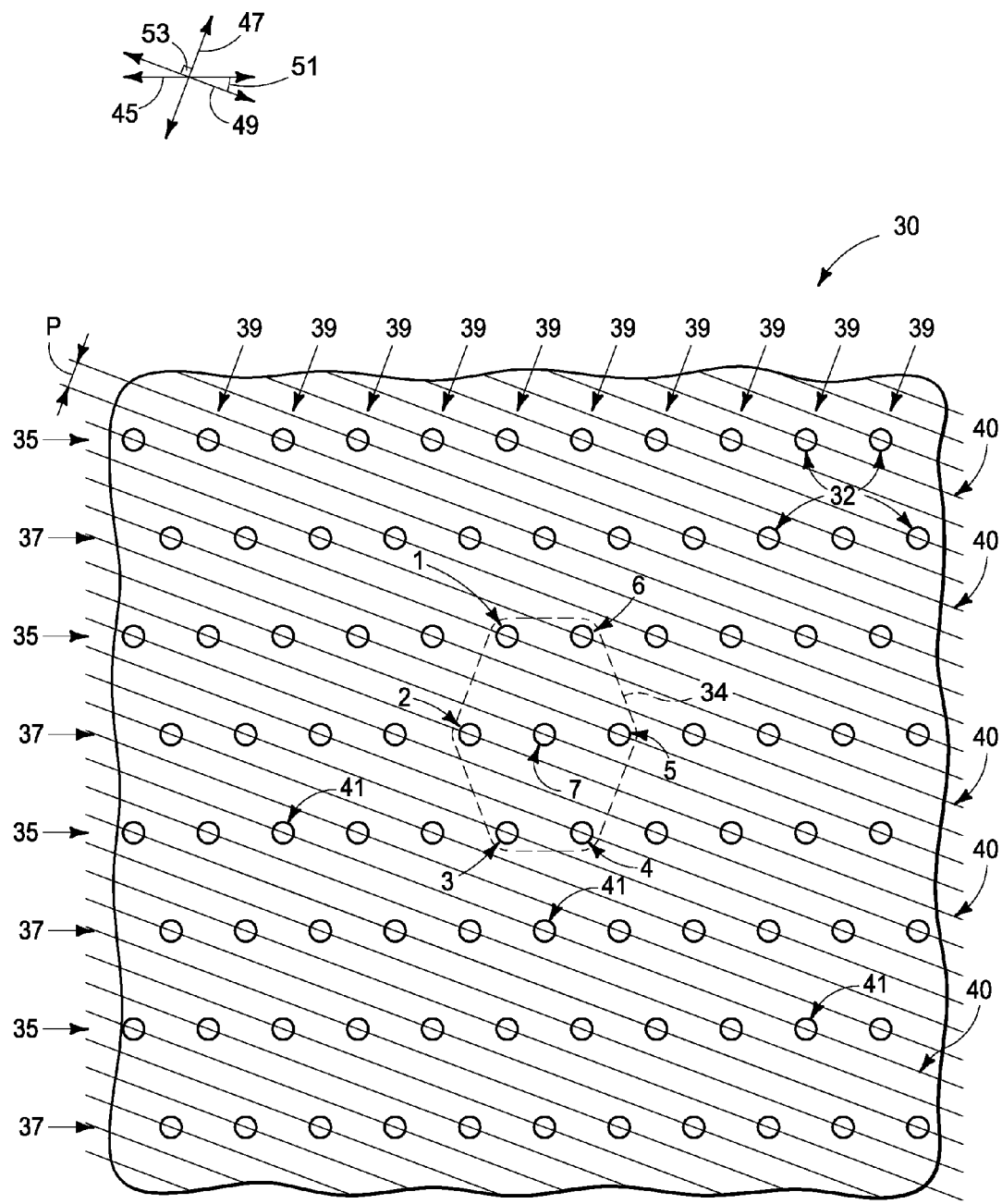
FIG. 6 is another diagrammatic top view of the example embodiment of FIG. 5, including an arrangement of data lines.

FIG. 6 illustrates an example layout of data lines 40 (for instance, bitlines) relative to the pillar packing arrangement of construction 30 (only some of the data lines are labeled). The data lines extend along a third direction of an illustrated axis 49. Such third direction is offset from the first direction of axis 45 (i.e., rows 35 and 37) by an angle 51 of less than 90°. The third direction of axis 49 (i.e., data lines 40) is substantially orthogonal to the second direction of axis 47 (i.e., columns 39), as illustrated by the right angle 53. The term "substantially orthogonal" is utilized to indicate that the direction of data lines 40 is orthogonal to the direction of columns 39 to within reasonable tolerances of fabrication and measurement. The illustrated layout of the data lines is an example layout, and other suitable layouts may be utilized in other embodiments. Notably, each of the pillars 1-7 within the repeating pillar pattern 34 is electrically coupled to a different data line than the other pillars within such repeating pattern.

The data lines are on a pitch "P". Such pitch may be any suitable pitch which enables each of the pillars 1-7 within a repeating pillar pattern 34 to be electrically coupled to a different data line than other pillars within such repeating pattern.

Figure 7:
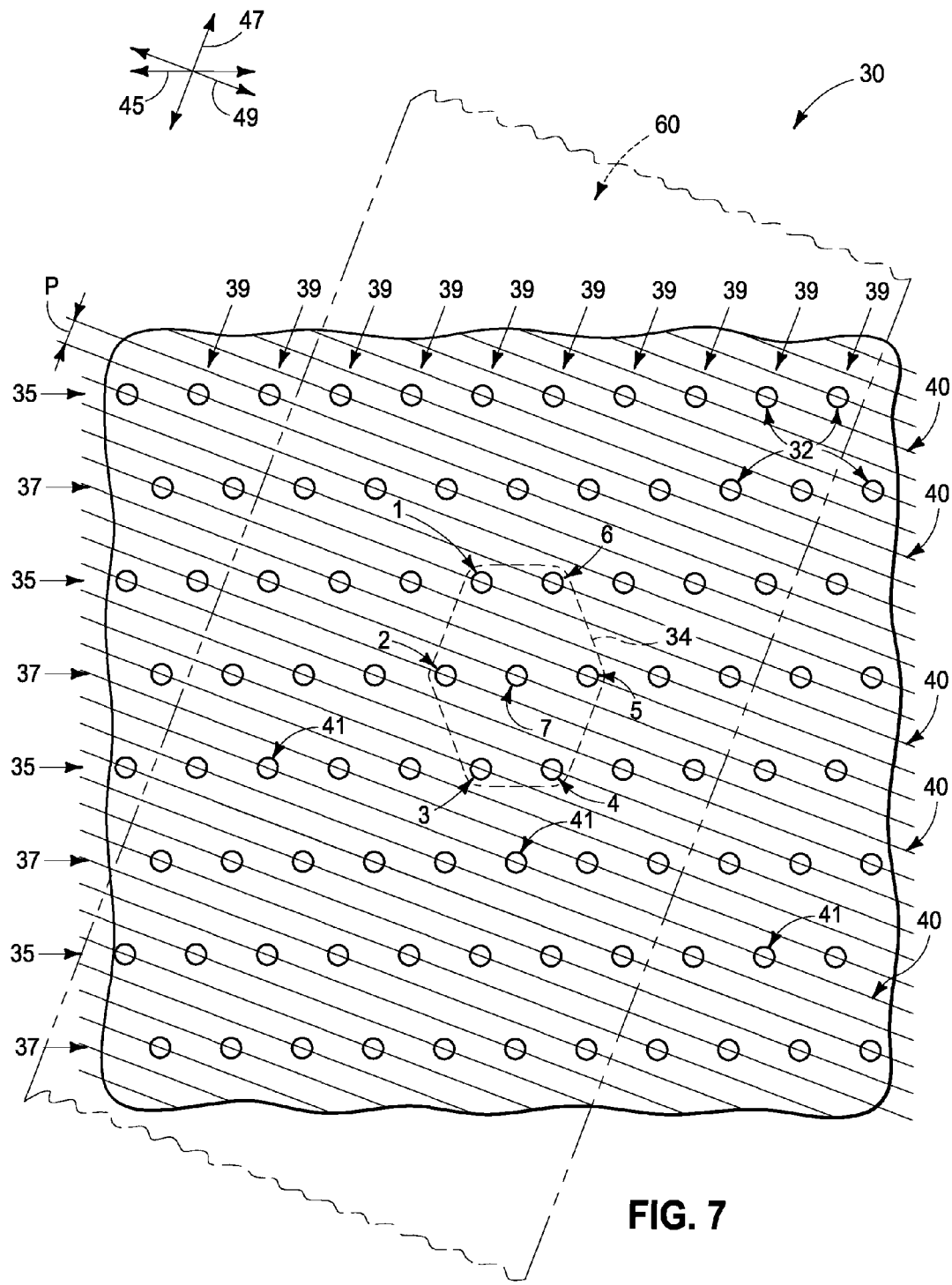
FIG. 7 is another diagrammatic top view of the example embodiment of FIG. 5, including an arrangement of data lines and drain-side select gates (SGDs).

FIG. 7 illustrates an example layout of a drain-side select gate (SGD) 60 relative to the pillar arrangement of construction 30. The illustrated SGD would be one of numerous SGDs, but only the single SGD is shown in order to simplify the drawing.

Notably, in the shown embodiment each of the pillars 1-7 within the repeating pillar pattern 34 is encompassed by the single SGD 60. In other words, each of the pillars within the illustrated repeating pattern 34 is at least partially surrounded by the single SGD, and activation of the SGD 60 electrically couples the seven different pillars (1-7) to seven different data lines.

As discussed above, a SGD defines a tile. In some embodiments, a single SGD will define a tile that comprises at least three pages.

The relative lengths of distances $d_s$ and $d_l$ may be tailored for specific applications. For instance, in some applications the relative lengths of such distances may be tailored to provide a desired ratio of pages per tile.

Figure 8:
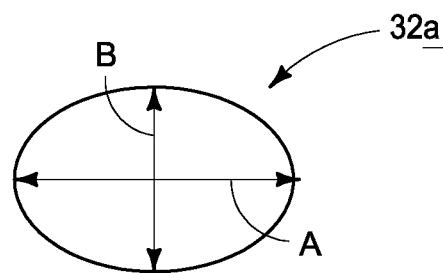
FIGS. 8 and 9 are diagrammatic top views of other example embodiment pillars.
Figure 9:
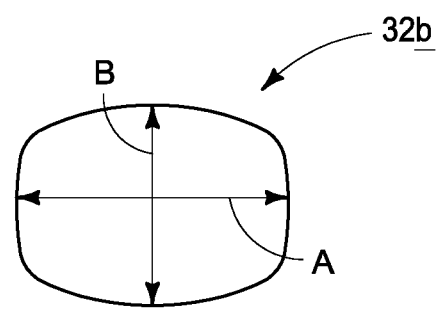

The illustrated pillars 32 of FIGS. 5-7 are circular-shaped when viewed from above. In other embodiments, other pillar configurations may be utilized. For instance, FIG. 8 is a top view of a pillar 32a which is elliptical-shaped when viewed from above, and FIG. 9 is a top view of a pillar 32b which is oval-shaped when viewed from above. In some embodiments, the shapes of FIG. 8 may each be considered to have a major axis "A" and a minor axis "B". In some applications it may be preferred that the ratio A:B be at least 2:1, and that a bitline direction may off from the minor axis by less than or equal to about 45 degrees. Such may enable a relaxed bitline pitch (which can reduce expenses relative to tighter bitline pitches, such as pitches formed utilizing pitch doubling processes) while maintaining desired high pillar densities. For instance, pillar density of circular pillars is related to the radius of the circle squared (specifically, $\pi r^2$), and similarly the pillar density of pillars of the type of FIG. 8 may be related to A*B.

The apparatuses discussed above may be incorporated into, or may comprise, electronic devices and systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an apparatus comprising a plurality of semiconductor pillars in a modified hexagonal packing arrangement. The modified hexagonal packing arrangement comprises a repeating pillar pattern, with the repeating pillar pattern having at least portions of 7 different pillars. Each of the different pillars in a respective one of the repeating pillar patterns is immediately adjacent to six neighboring pillars. A distance to two of the six neighboring pillars is a short distance, $d_s$; and a distance to four of the six neighboring pillars is a long distance, $d_l$. The distance $d_l$ is greater than the distance $d_s$.

Some embodiments include an apparatus comprising a plurality of semiconductor pillars in a packing arrangement. The packing arrangement comprises alternating first and second rows of pillars, with pillars in the first rows being laterally offset relative to pillars in the second rows. A distance between neighboring pillars in a common row as one another is a short distance, $d_s$, and a distance between neighboring pillars that are not in common rows as one another is a long distance, $d_l$; with $d_l$ being greater than $d_s$. The first and second rows extend along a first direction. The distance $d_l$ is along columns that extend along a second direction which intersects the first direction. A plurality of data lines extend across the pillars. The data lines extend along a third direction which is offset from the first direction by less than 90 degrees, and which is substantially orthogonal to the second direction.

Some embodiments include an apparatus comprising a plurality of semiconductor pillars in a modified hexagonal packing arrangement. The modified hexagonal packing arrangement comprises a repeating pillar pattern, with the repeating pillar pattern having at least portions of 7 different pillars. Each of the different pillars in a respective one of the repeating pillar patterns is immediately adjacent to six neighboring pillars. A distance to two of the six neighboring pillars is a short distance, $d_s$, and a distance to four of the six neighboring pillars is a long distance, $d_l$; with $d_l$ being greater than $d_s$. The distance $d_s$ is along rows that extend along a first direction. The distance $d_l$ is along columns that extend along a second direction which intersects the first direction. A plurality of data lines extend across the pillars. The data lines extend along a third direction which is offset from the first direction by less than 90 degrees, and which is substantially orthogonal to the second direction. Each of the pillars in a respective one of the repeating pillar patterns is encompassed by a single drain-side select gate (SGD).

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An apparatus comprising:
semiconductor pillars in a modified hexagonal packing arrangement; the modified hexagonal packing arrangement comprising a repeating pillar pattern, with the repeating pillar pattern having at least portions of 7 different pillars of said semiconductor pillars; each of the different semiconductor pillars in a respective one of the repeating pillar patterns being immediately adjacent to six neighboring of said semiconductor pillars; a distance from a central pillar to two of the six neighboring semiconductor pillars being a short distance, $d_s$; and a distance from the central pillar to four of the six neighboring semiconductor pillars being a long distance, $d_l$; with $d_l$ being greater than $d_s$; and
a plurality of data lines extending across the modified hexagonal packing arrangement; and wherein each of the different semiconductor pillars in a respective one of the repeating pillar patterns is electrically coupled to a different data line of the plurality of data lines.

2. The apparatus of claim 1 wherein $d_l$ is at least about 1.1 times $d_s$.

3. The apparatus of claim 1 wherein $d_l$ is at least about 1.3 times $d_s$.

4. The apparatus of claim 1 wherein $d_l$ is at least about 1.5 times $d_s$.

5. The apparatus of claim 1 wherein the semiconductor pillars are substantially circular-shaped when viewed from above.

6. The apparatus of claim 1 wherein the semiconductor pillars are substantially elliptical-shaped when viewed from above.

7. The apparatus of claim 1 wherein the semiconductor pillars are substantially oval-shaped when viewed from above.

8. The apparatus of claim 1 wherein the semiconductor pillars comprise silicon.

9. The apparatus of claim 1 wherein the semiconductor pillars comprise polysilicon at least partially surrounding a dielectric material.

10. An apparatus comprising:
semiconductor pillars in a packing arrangement; the packing arrangement comprising alternating first and second rows of the semiconductor pillars, with the semiconductor pillars in the first rows being laterally offset relative to the semiconductor pillars in the second rows; a distance between neighboring of the semiconductor pillars in a common row as one another being a short distance, $d_s$, and a distance between neighboring of the semiconductor pillars that are not in common rows as one another being a long distance, $d_l$; with $d_l$ being greater than $d_s$;
the first and second rows extending along a first direction;
the distance $d_l$ being along columns that extend along a second direction which intersects the first direction; and
a plurality of data lines extending across the semiconductor pillars; the data lines extending along a third direction which is offset from the first direction by less than 90 degrees, and which is substantially orthogonal to the second direction.

11. The apparatus of claim 10 wherein the packing arrangement is a modified hexagonal packing arrangement; and wherein the modified hexagonal packing arrangement comprises a repeating pillar pattern, with the repeating pillar pattern having at least portions of 7 different pillars of said semiconductor pillars.

12. The apparatus of claim 10 wherein $d_l$ is within a range of from about 1.1 times $d_s$ to about 5 times $d_s$.

13. The apparatus of claim 10 wherein the semiconductor pillars are substantially vertical.

14. The apparatus of claim 10 wherein the data lines comprise bitlines.

15. The apparatus of claim 10 wherein at least some of the semiconductor pillars are substantially elliptical-shaped or substantially oval-shaped when viewed from above.

16. An apparatus comprising:
semiconductor pillars in a modified hexagonal packing arrangement; the modified hexagonal packing arrangement comprising a repeating pillar pattern, with the repeating pillar pattern having at least portions of 7 different of said semiconductor pillars, each of the different semiconductor pillars in a respective one of the repeating pillar patterns being immediately adjacent to six neighboring semiconductor pillars; a distance from a central pillar to two of the six neighboring semiconductor pillars being a short distance, $d_s$, and a distance from the central pillar to four of the six neighboring semiconductor pillars being a long distance, $d_l$; with $d_l$ being greater than $d_s$;

the distance $d_s$ being along rows that extend along a first direction;

the distance $d_l$ being along columns that extend along a second direction which intersects the first direction;

a plurality of data lines extending across the semiconductor pillars; the data lines extending along a third direction which is offset from the first direction by less than 90 degrees, and which is substantially orthogonal to the second direction; and wherein each of the semiconductor pillars in a respective one of the repeating pillar patterns is encompassed by a single drain-side select gate (SGD).

17. The apparatus of claim 16 wherein said each of the semiconductor pillars in a respective one of the repeating pillar patterns being encompassed by a single drain-side select gate (SGD) comprises each of the semiconductor pillars in the respective one of the repeating pillar patterns being at least partially surrounded by the single SGD, and wherein activation of the single SGD electrically couples the 7 different semiconductor pillars to 7 different data lines.

18. The apparatus of claim 17 wherein the drain-side select gate (SGD) defines a tile, and wherein there at least three pages within said tile.

19. The apparatus of claim 16 wherein $d_l$ is at least about 1.1 times $d_s$.

20. The apparatus of claim 16 wherein $d_l$ is at least about 1.3 times $d_s$.

21. The apparatus of claim 16 wherein $d_l$ is at least about 1.5 times $d_s$.

* * * * *